United States Patent [19]

Miyasaka

[11] Patent Number: 5,260,559
[45] Date of Patent: Nov. 9, 1993

[54] METHOD OF DETECTING IMAGE INFORMATION BY PHOTOELECTRIC DEVICE

[75] Inventor: Tsutomu Miyasaka, Minami-Ashigara, Japan

[73] Assignee: Fuji Photo Film Co., Ltd., Kanagawa, Japan

[21] Appl. No.: 856,738

[22] Filed: Mar. 24, 1992

[30] Foreign Application Priority Data

Apr. 11, 1991 [JP] Japan ................................ 3-78049
Apr. 11, 1991 [JP] Japan ................................ 3-78050
Apr. 11, 1991 [JP] Japan ................................ 3-78053

[51] Int. Cl.$^5$ ............................................... H01J 40/14
[52] U.S. Cl. ........................... 250/208.1; 382/65
[58] Field of Search ................ 250/208.1, 214.1; 382/65; 358/471, 474

[56] References Cited

U.S. PATENT DOCUMENTS 5,107,104  4/1992  Miyasaka .................... 250/214.1

Primary Examiner—David C. Nelms
Assistant Examiner—K. Shami
Attorney, Agent, or Firm—Sughrue, Mion, Zinn, Macpeak & Seas

[57] ABSTRACT

A method of detecting image information which enables real-time extraction of mobile components of optical input image information in the form of electric current signals or real-time extraction of outlines of optical input image information in the form of electric current signals. The method uses a photoelectric device having a photoreception plane carrying arrays of pixels of a photosensitive material capable of directly converting an optical input signal into an electric current signal. The photosensitive material is endowed in itself with a differential responsivity which changes the level of the materials's output electric current in accordance with the rate of change in the incident light intensity of the optical input signal per unit time, so that only mobile components of the input image information are selectively and automatically detected in real time in the form of electric signals. It is also possible to extract only the profile component of the input image information, by oscillating, at a predetermined period, an optical system through which the optical input signal is irradiated on the photoelectric device so as to create a positional oscillation of the optical input signal on the photoreception surface or, alternatively, by oscillating the photoelectric device in directions parallel to the photoreception surface.

15 Claims, 3 Drawing Sheets

METHOD OF DETECTING IMAGE INFORMATION BY PHOTOELECTRIC DEVICE

BACKGROUND OF THE INVENTION

The present invention relates to a novel method for detecting optical image information and, more particularly, to a method for processing optical image information by a photoelectric device, wherein a specific image processing is performed by a photosensitive material itself that serves as a photoreceptor. Still more particularly, the present invention is concerned with an image detection method in which a photosensitive chromoprotein having visual functions such as bacteriorhodopsin is used as the photosensitive material and in which optical information processing function peculiar to such a protein is effectively utilized.

Current progress in fine processing techniques and photolithography has brought about a remarkable increase in the recording density of image information. At the present stage, however, development of high-density photo-sensors and high-density recording elements mostly relies upon fine processing technology which employs silicon as a photosensitive material, so that the function of the photosensitive material is ruled by the characteristics of silicon and its junction devices. Consequently, processing of input image information is enabled by electronic circuit manipulations and computer software, although the recording density can be improved by advance in silicon technology.

Charge coupled device based on silicon is a typical example of image-sensing device which can detect image information at high density. In this type of device, optical signal is converted into a quantity of charge and is electrically stored as a memory. The stored information is read by a circuit through a linear serial scanning of memories and is then displayed as two-dimensional information. This method employs a method in which memory is reset at a predetermined time interval in order to trace a change in the information in relation to time.

The conventionally used photosensitive material which is mainly made from silicon, however, does not possess any processing function necessary for identification of information, such as detection of mobile image and extraction of edge lines which are inherently possessed by visual cells of living creatures, which would be demanded of an image information processing system in near future. This limits potential development and realization of the future photosensitive device as so-called intelligent sensor. As a result, electric circuits for processing output information and computer networks are heavily burdened in order to enable a solid-state device photodiode to work in a visual information processing system. For instance, a pattern recognition and matching operation essentially requires, as the first step, pick-up of the outline of the object. Extraction of the outline component is a highly important factor of pattern recognition. In addition, detection of motion of the object requires a real-time extraction of only the dynamic or mobile components of the optical information. The image extraction must essentially and significantly be backed up by auxiliary functions such as adaptation and profile contrast stressing. These functions are important factors which are inherently possessed by vision of living creatures and are goals to be attained by photo-sensors of the next era. Such functions, however, can hardly be achieved by solid-state devices which are presently available such as photo-diodes.

T solve the above problem, the invention of the present application seeked the above function for biological material without sticking to use of a solid device or an electrical circuit, and processed with this study under consideration of obtaining some elements having an information processing means according to the visual sense.

SUMMARY OF THE INVENTION

Accordingly, an object of the present invention is to provide a method of detecting image information by using a photoelectric device having a photoreception surface carrying arrays of pixels of a photosensitive material capable of directly converting an optical input signal into an electric signal, wherein the improvement comprises that the photosensitive material is a differential responsive-type photosensitive material which changes the level of the output electric current in accordance with the rate of change in the light intensity of the optical input signal per unit time, whereby only mobile components of the input image information are selectively detected in real time in the form of electric signals.

Another object of the present invention is to provide a method of detecting image information by using a photoelectric device having a photoreception surface carrying arrays of pixels of a photosensitive material capable of directly and differentially converting an optical input signal into an electric current signal, wherein the improvement comprises that an optical system through which said optical input signal is input to the photoelectric device is oscillated, so as to irradiate the optical input signal to the photoelectric device while creating a geometrical oscillation in directions parallel to the -photoreception surface of the photoelectric device, whereby the profile components of the optical input signal are detected.

Still another object of the invention is to provide a method of detecting image information by using a photoelectric device having a photoreception surface carrying arrays of pixels of a photosensitive material capable of directly and differentially converting an optical input signal into an electric current signal, wherein the improvement comprises that the photoelectric device is mechanically oscillated in the directions parallel to the photoreception surface during the irradiation of the photoreception surface with the optical input signal, whereby profile components of the input image information are detected in real time.

BRIEF DESCRIPTION OF THE DRAWINGS

FIG. 3 is an illustration of the profile of letter information which is obtained on an LED (light emitting diode) panel when the optical axis of the incident light is subjected to a random circular oscillation in parallel with a photoreceptor surface, wherein the square form appearing in the drawings indicates a square LED of the display panel, while black portions indicate blocks of LED pixels which have been turned on;

FIG. 4 is an illustration of the profile of letter information which is obtained on an LED panel when the optical axis of the incident light is oscillated in parallel with a photoreceptor surface and in parallel to the vertical axis of the letter, wherein the square form appearing in the drawings indicates a square LED of the display panel, while black portions indicate blocks of LED pixels which have been turned on;

FIG. 5 is an illustration of the profile of letter information which is obtained on an LED panel when the optical axis of the incident light is oscillated in parallel with a photoreceptor surface and in parallel to the horizontal axis of the letter, wherein the square form appearing in the drawings indicates a square LED of the display panel, while black portions indicate blocks of LED pixels which have been turned on;

FIG. 7 is an illustration of the profile of letter information which is obtained on an LED panel when the device is subjected to a random circular oscillation in parallel with a photoreceptor surface, wherein the square form appearing in the drawings indicates a square LED of the display panel, while black portions indicate blocks of LED pixels which have been turned on;

FIG. 8 is an illustration of the profile of letter information which is obtained on an LED panel when the photoelectric device is oscillated in parallel with a photoreceptor surface and in parallel to the vertical axis of the letter, wherein the square form appearing in the drawings indicates a square LED of the display panel, while black portions indicate blocks of LED pixels which have been turned on; and FIG. 9 is an illustration of the profile of letter information which is obtained on an LED panel when the photoelectric device is oscillated in parallel with a photoreceptor surface and in parallel to the horizontal axis of the letter, wherein the square form appearing in the drawings indicates a square LED of the display panel, while black portions indicate blocks of LED pixels which have been turned on.

DESCRIPTION OF THE PREFERRED EMBODIMENTS

Figure 1:
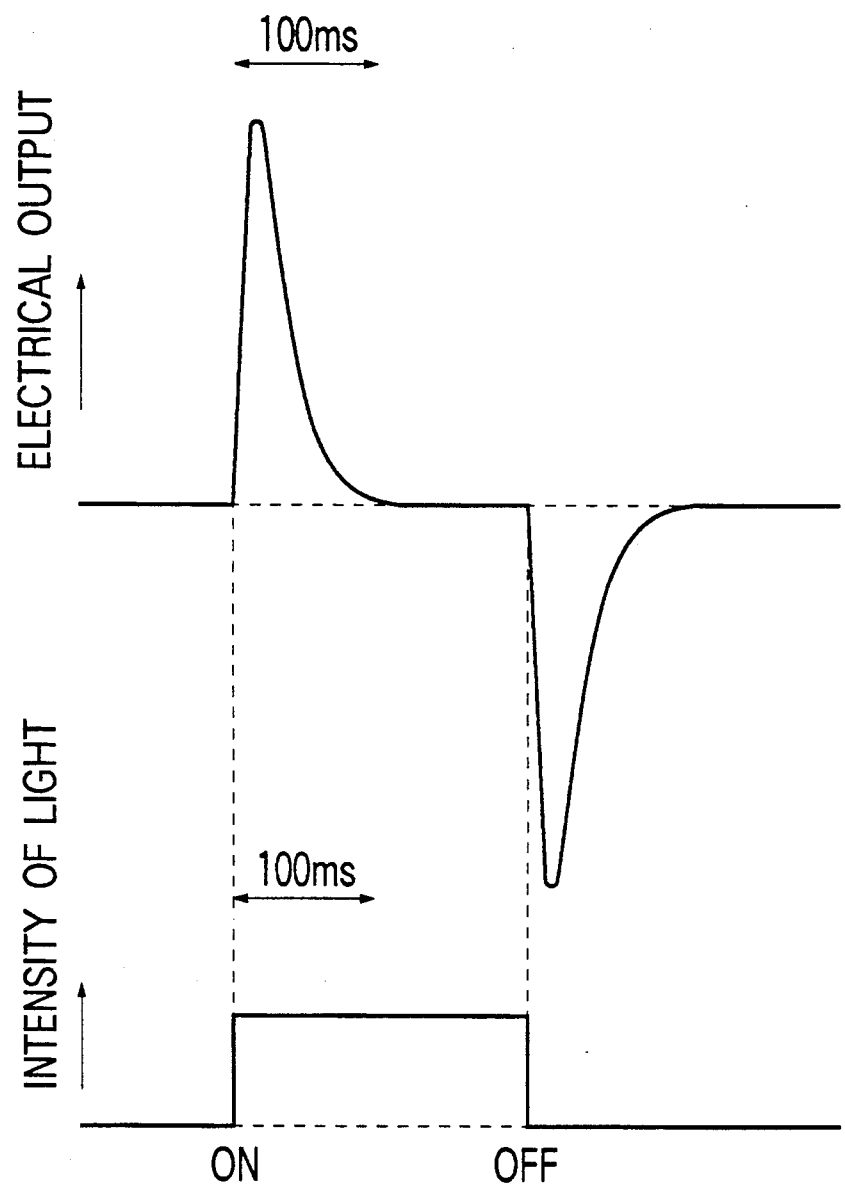
FIG. 1 is an illustration of a typical example of photo current response pattern in a differential responsive type photoelectric device used in the present invention.

The differential responsive type photoelectric device used in the present invention provides a photo-current response pattern which is exemplarily shown in FIG. 1. For instance, when a light intensity pattern as a function of time which is shown as a reference signal in lower part of FIG. 1 is applied to the device, the device positively respond at the moment of incidence of the light but its output is instantaneously offset to the original value (base line) to provide a steady output "0". The device then responds negatively at the moment when the light is turned off. The positive and negative responses of the device correspond to increase and decrease in the light intensity. The level of the transient response output is proportional to the rate of change in the light quantity of the input information per unit time, i.e., the value obtained by differentiating the light quantity by time. Therefore, when the light information of a constant light quantity is turned on and off at the same rate, the responsive photo-current obtained in the device shows a symmetrical waveform having positive and negative portions as illustrated in FIG. 1.

Photosensitive chromo-proteins are suitably used as the photosensitive materials which provide the desirable responsive characteristic described above. This is because a photosensitive chromo-protein performs unidirectional (vectorial) separation of charges at high efficiency under absorption of visible rays. Among various photosensitive chromo-protein, particularly suitably used is bacteriorhodopsin, which, as well as chlorophyll proteines present in a photosynthesis reaction center, is representative of photosensitive chromo-protein and which, as well as visual pigment rhodopsin, is known as a typical example of retinal protein that incorporates retinal as chromophore. Bacteriorhodopsin can be obtained in the form of a disk-like membrane piece (size approximately 0.5 $\mu$m) referred to as "purple membrane", from the plasma membrane of halobacterium halobium, by, for example, a process which is described in D. Oesterhelt, W. Stoeckenius, Methods in Enzymology, 31. pp 667-678 (1974). Therefore, bacteriorhodopsin is used mostly in the form of the purple membrane. Bacteriorhodopsin is composed of opsin that constitutes the protein portion and retinal which is embedded in the opsin to form a Schiff base being bonded to a site of opsin. A broad visible absorption (peak at 550-570 nm) is endowed by virtue of a long wavelength shift called "opsin shift" according to the Schiff base.

Bacteriorhodopsin is a kind of membrane protein having a transportation function which performs, under absorption of light, vectorial transportation of hydrogen ions from the intercellular side to the extracellular side of the membrane. Due to this function, bacteriorhodopsin is also named as "proton pump". A detailed explanation is given of this proton pump function, in Akira Ikegami, PROTEIN, NUCLEIC ACID AND ENZYME, Vol. 34, pp 440-461 (1989) or Akira Ikegami et al., Springer Proc. Phys., 20, pp 173-182 (1987). Mobility of proton, i.e.,positive charge, in response to light is significant phenomenon which makes various photoelectric effects possible for in vitro bacteriorhodopsin.

In vitro applications of bacteriorhodopsin have been shown, for example, in K. Singh et al., Biophy. J., 31, pp 393-402 (1980), K. Ihara and Y. Mukohata, FEBS Letters, 240, pp 148-152 (1988) or S. Y. Liu, Biophys. J., 57, pp 943-950 (1990), as well as literatures cited in these articles. The most common method is to form a sandwich-type dry voltaic cell by disposing an oriented dry thin film of bacteriorhodopsin or purple membrane between two types of electrodes and to measure photovoltage produced between these electrodes. Basic method of this technique is described in, for example, G. Varo, Acta Biol. Acad. Sci. Hungary, 32, pp 301-310 (1981).

A device having the following construction is most suitably used in the present invention as a photoelectric device which makes a differential responsive-type response to a change in the light intensity. Namely, the device which is used most suitably has two types of electrodes (working electrode and counterelectrode), a hydrophilic layer of an electrolyte which is sandwiched between these electrodes, and a thin film of bacteriorhodopsin attached to one of the electrodes. The bacteriorhodopsin thin film contacts at its one side with the working electrode and at its other side with the hydrophilic electrolyte layer, thus providing a junction structure composed of the working electrode, bacteriorhodopsin layer, hydrophilic layer and counterelectrode. This wet junction type device is most efficient for obtaining a differential response to light, a main function needed for the present invention. By arranging the working electrode as a group of minute electrodes, it is possible to array a 2-dimensional network such devices on a photoreception plane and to fabricate an image sensor.

Extraction of a mobile image by the image sensor in real time is enabled with the present invention by making direct use of the differentiation response function. Namely, the invention is to selectively pick up, in the form of electric current response, any change in the light quantity caused by irradiation of optical information concerning mobile component of the image.

The photoelectric device used in the present invention provides a unique visual functioned image sensor which is composed of two-dimensional array of a plurality of photosensitive material elements. In operation, optical information is made to directly impinge upon the photoreception surface of this sensor, so that only the mobile components of the optical information or only information component with a change in the light quantity is detected in the form of photo-current output from the photosensitive material elements.

According to the present invention, for the purpose of color resolution of information, it is possible to perform color image processing, provided that two or more types of photosensitive material elements having different sensitivities to wavelengths are combined in thicknesswise direction of the image sensor or arranged in the same plane in the image sensor.

A description will now be given of a method of the invention for detecting optical information.

The optical sensor used in the present invention is a sensor of the type which responds to a change in light quantity with a high degree of sensitivity. The light carrying information and incident to this sensor is made to impinge upon the sensor in such a state as to oscillate in the direction of the photoreception plane of the sensor, the path of the light being geometrically modulated when the light passes through an optical system before entering the sensor. That is, the incident light impinges upon the photoreception plane of the sensor such that the position of incidence varies in relation to time.

In an alternative method, the sensor which is in receipt of the image information is mechanically and periodically oscillated in the direction of the photoreception surface of the sensor. As a result of the oscillation, the incident image information reciprocally scans the photoreception plane of the sensor at a constant period. No specific restriction is posed on the pattern of oscillation of the optical axis of the incident light or the oscillation of the sensor. It is, however, necessary that within a short time, e.g., 1 second, the oscillation is performed at a constant time interval or period and with a constant positional amplitude. The oscillation may be a rotation along a circular path or a reciprocating motion along a curvilinear or straight line.

The oscillation of the optical axis may be effected by periodically vibrating a mirror or a prism placed in the optical system or by electrically driving a spatial light modulator made of a material which brings about a refractive index change in response to electric signal. The use of spatial light modulator is advantageous in that it does not produce any mechanical vibration.

In order to enable the mobile image information to be traced with a certain degree of time resolution while maintaining acceptable level of continuity of the displayed information image, the period of positional oscillation of the optical system or the period of oscillation of the sensor, i.e., photoelectric device, is preferably 20 Hz or higher in terms of frequency and 50 ms or less in terms of period and more preferably, 35 Hz or higher in terms of frequency and 30 ms or less in terms of period.

In the case where the photoelectric sensor is of the type having a multiplicity of pixels which receive image information, the amplitude of the positional oscillation imparted in the direction of the photoreception surface by the oscillation of the optical system or by the oscillation of the sensor is preferably determined to meet the following condition:

$$H \geq S^{1/2}$$

where, H is the actual size of the amplitude, while S represents the light receiving area of each photosensitive material element, i.e., the pixel. When this condition is met, the path or locus of positional oscillation of the incident light on the photoreception surface essentially traverses at least one pixel, so that a change in the light quantity, representing a profile component or a boundary component of the image information, can be detected by this pixel. In a typical photo-sensor, pixels are arranged two-dimensionally on the photoreception surface leaving certain gaps (normally less than the pixel size) between the adjacent pixels. Taking into consideration the size of such gaps, the amplitude of oscillation is preferably determined to meet the following condition.

$$H \geq 2S^{1/2}$$

The method of the present invention for detecting optical image information is characterized in that it enables a real-time detection of the profile portion or the boundary portion (portion where the color and/or density of light forming the image is changed) of the image. This feature makes it possible to conduct various processings of the image information at the photoreceptor, in other words at the entrance for the optical information. Namely, by suitably changing the amplitude and/or period of oscillation in the described method, it is possible to control the degree of emphasizing of profile and the degree of emphasizing the contrast of the image. Furthermore, by suitably selecting the pattern of the oscillation, it is possible to selectively extract vertical and horizontal components of the profile in the image information. It is also possible to detect only an object moving in a specific direction from among objects contained in a mobile image information.

The method of the present invention may be followed by or combined with one or more of the following additional operations, in accordance with the purpose of the image processing.

(1) An operation for imparting oscillation of light intensity only for selected pixels or sensors having specific photosensitivity wavelength region, in order to process a color image through color separation.

(2) An operation in which the oscillation of light intensity in the method of the invention is conducted while the conditions of oscillation are varied with time.

(3) An operation in which two or more types of photoelectric devices are simultaneously used for a single input image to perform multiple processing.

The present invention will be more fully understood from the following description of Examples which, however, are not intended to limit the scope of the invention.

EXAMPLE 1

Purple membranes containing bacteriorhodopsin were separated and purified from cells of halobacterium halobium by density gradient centrifugation according to the method described by Oesterhelt et al., Methods in Enzymology, 31, 667 (1974). The purple membranes thus obtained were dispersed in pure water to give a suspension with absorbance of 6.0 (560 nm).

Then, 100 μl of hexane and 20 μl of DMF were added to 100 μl of the aqueous suspension of the purple membrane and the resulted mixture was shaken in a vibration mixer to yield an opaque suspension for spreading monolayer of purple membrane.

The suspension was spread on the water phase contained in a Langmuir film balance, whereby a monolayer film of bacteriorhodopsin composed of a 2-dimensional suspension of purple membranes wa obtained. This monolayer film was then compressed to develop a surface pressure of 30 mN/m and was transferred, under this constant surface pressure, by a horizontal attaching method, onto a transparent electrode plate (3 cm wide, 3 cm long) having a square pixel pattern (size of pixels being 1 × 1 mm and number of pixels being 256) formed of a layer of ITO (Indium Tin Oxide) having a thickness of 1000 Angstrom and conductivity of $6 \times 10^3$ cm$^{-1}$. The attaching transfer process was repeated so that 20 layers of purple membranes were built-up on the substrate. Subsequently, the layer of the purple membranes was dipped in 1% aqueous solution of glutaraldehyde, followed by a rinsing and a subsequent fixing of the purple membranes by cross-linking.

A gold-layer coated glass electrode (1 mm thick) as a common counterelectrode was placed, through the intermediary of hollow spacers (200 200 μm thick) made of Tefron, on the patternized ITO substrate (1.1 mm thick) carrying bacteriorhodopsin, and the space defined by the spacers was filled with an electrolyte which in this case was a 3% aqueous solution of agar (pH 7.0, 40° C.). A photoelectric device having a junction structure composed of the layers of ITO, bacteriorhodopsin, electrolyte and gold electrode was thus prepared. A bias voltage of −0.6 V was applied to the ITO pixels of the device via an external circuit. The current output from the device was supplied to an operation amplifier so as to be converted into voltage and then amplified. The amplified voltage signal was delivered to an LED having 256 picture units, whereby a two-dimensional display of the signals was obtained on the LED.

Thus, an image information processing system was built up, composed of the differential responsive type photoelectric device (image sensor) having 256 pixels and the LED display panel. Various alphabetic letters were projected as optical information onto the sensor through the ITO substrate, by means of a 150 W slide projector.

The projection of the letter images from the slide projector was conducted at a constant level of light quantity. When images of letters such as T, E and S are made to impinge upon the device, the entire images were lighted up and displayed in real time on the LED display panel in the form of blocks of LED pixels, but under a constant irradiation of image, but the display disappeared shortly. The photoelectric response of the device responding to the incidence of a letter image was monitored by means of a digital storage oscilloscope. It was confirmed that rise time of the initial transient photoresponse, obtained after the amplification performed by the operation amplifier, was 200 μs or less. It was also confirmed that, when the incidence of the letter image was maintained, the response relaxed to the zero level within 100 ms and, on switching off of the incident image, a negative response, i.e., a response in opposite direction to that obtained on the incidence of the letter image, was obtained. Thus, the pattern of the response was a differential responsive waveform similar to that shown in FIG. 1.

The letter image was then made to incident to the photoreception surface of the device so as to move up and down and to the left and right on the surface. Consequently, the motion of the incident letter image was reproduced and displayed on the LED display panel by a movement of the blocks of the lighted pixels. The display was continued as long as the motion of the incident letter image was continued, but was turned off as soon as the motion was stopped. It was thus confirmed that the device of this Example can respond to a still image information only at the moment of input of such image information and does not continue the display of such image, and that the device selectively responds only to any dynamic or mobile component of the image.

An experiment was also conducted in which the speed of motion of the mobile letter image was changed. Namely, the rate of scan of the photoreception surface by the incident letter image was progressively changed from low speed to high speed. Consequently, it was confirmed that the level of the signal delivered to the LED from the portion of the photoelectric device passed by the image light increases as the rate of scan increases. This demonstrates that the device provided a higher level of output in response to image information having higher motion speed. It was also confirmed that LEDs are not lighted up substantially, i.e., the information cannot be monitored, when the incident image information was moved at a slow speed. Furthermore, it was confirmed that there is a threshold level for the scanning rate necessary for activating the LEDs, i.e., for providing an output voltage of abut 0.5 V necessary for activating the LEDs, and that such threshold level can be controlled by varying the sensitivity of the photosensitive material containing bacteriorhodopsin, which is effected by changing the level of the bias voltage applied to this photosensitive material.

It was thus understood that the described photoelectric device having differential responsive function can respond to a motion of the image information with a high level of sensitivity and that the device enables only the components having motion speed greater than a predetermined speed to be selectively extracted in the form of image, by a suitable control of the sensitivity of the photosensitive material.

EXAMPLE 2

A description will now be given of another Example which was carried out by using an image processing system similar to that of Example 1 while oscillating the optical system.

In this case, a plastic optical lens, having a diameter of 40 mm and a focal length of 5 cm, was placed by being suspended from a support at a position which is spaced 7.5 cm from the incident end of the sensor, i.e., at the same side as the image light source, and the letter image was made to be incident to the sensor through this lens. During the irradiation with the image information light, the lens was oscillated by means of a cam powered by a micromotor (RF-300 CA, produced by Mabuchi Motor Kabushiki Kaisha). The oscillation was imparted such that the lens was oscillated in directions parallel to the photoreception surface of the sensor at a rate of 3000 cycles per minute (50 Hz) and such that the position of the centroid was fixed. The optical system on the projector was adjusted such that the incident image was focused at a position which was 7.5 cm ahead of the lens, i.e., at the same side as the optical system. The lens oscillation driving system was si adjusted that the image finally formed on the photoreception surface of the image sensor move circularly with a geometrical offset (amplitude) of 2 mm.

Figure 2:
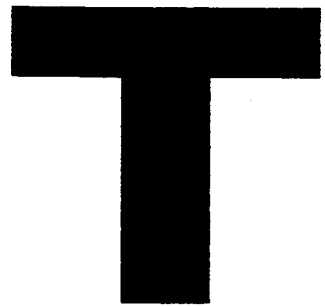
FIG. 2 is an illustration of an optical letter image (T) incident to the device.
Figure 3:
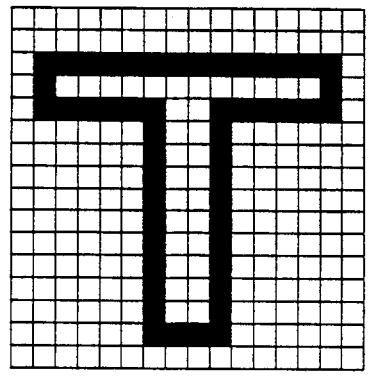
Figure 4:
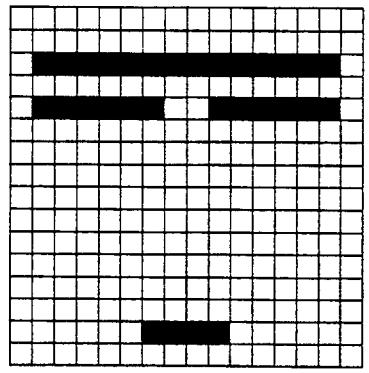
Figure 5:
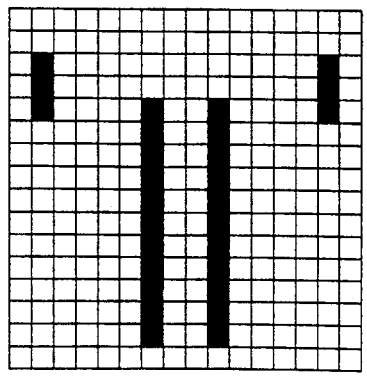

An alphabetic letter image "T" was projected on the image sensor as shown in FIG. 2. As a result, only the outline portions of the letter "T" were displayed on the LED display panel, as shown in FIG. 3. It was confirmed that the number of the pixels participating in the detection of each outline portion is one or two as measured from the number of the pixels which were turned on and off, in the direction of the thickness of the outline. Then, the lens oscillation drive system was adjusted so as to give the lens a reciprocating oscillation only in the directions parallel to the vertical axis of the letter "T" (vertical oscillation). In this case, only the outline portions of the horizontal part of the letter "T" were displayed, as shown in FIG. 4. Further, the oscillation mode was changed to provide oscillation only in the horizontal directions. In this case, only the vertical outline of the letter "T" were selectively displayed. It was thus possible to detect any desired outline component of the letter image by suitably selecting the oscillation mode. Similar extraction of outline information could be done also for other 25 alphabetic letters.

Subsequently, images of straight lines having different line widths were input, and oscillation was imparted in the vertical directions crossing the straight bar images. In this case, the width of each bar was displayed by two parallel outlines. The width represented by the distance between these two outlines well indicated the width of each bar. Namely, outlines were spaced by a large distance for a wider bar and by a small distance for a narrower bar.

An experiment was also conducted in which the image of an oscillating object was input to optically determine the amplitude of oscillation of the object. More specifically, an aluminum substrate 5 mm thick was used as the object and was oscillated vertically with an amplitude of 1 mm at a random rate of 5 to 50 cycles per minutes. Light was irradiated onto this oscillating substrate and the light reflected by the substrate was made to impinge upon the sensor through an optical lens which position was kept stationary. As a consequence, the amplitude components in the form of distribution pattern on the aluminum substrate was displayed as the output image on the LED display panel.

As an alternative method for modulating the incident light, a pair of oscillation mirrors were used in place of the oscillated lens described above. More specifically, a first mirror (mirror 1) formed by evaporation of aluminum was placed on the incident side of the sensor, and the incident light reflected by this mirror was further reflected by a second mirror (mirror 2) before entering the sensor. The first mirror and the second mirror were mechanically and independently vibrated such that the first mirror oscillates horizontally while the second mirror oscillates vertically, at a common frequency of 40 Hz. Extraction of the profile of the letter information could be done successfully also by this method. In this method, two types of mirrors conduct two kinds of oscillation modulation, i.e., horizontal and vertical oscillation modulations. It is therefore possible to easily carry out processing of image information in a desired processing mode or pattern, by selectively operating one of these mirrors or both of these mirrors.

EXAMPLE 3

A description will now be given of still another Example which employed an image processing system similar to that of Example 1, with the sensor itself being oscillated.

Figure 6:
FIG. 6 is an illustration of an optical letter image (E) incident to the device.
Figure 7:
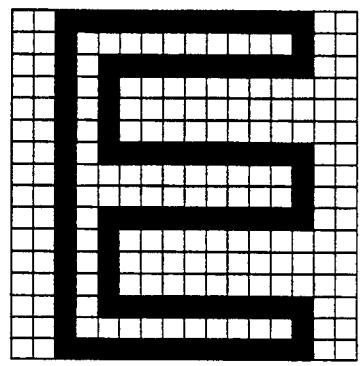

During the irradiation of the letter image as the optical information, the sensor itself was oscillated in the directions parallel to the photoreception surface at a frequency of 3000 cycles per minute (50 Hz, 20 ms period) by means of a cam powered by a micromotor (RF-300CA, produced by Mabuchi Motor Kabushiki Kaisha). The oscillation mode was determined such that the image formed on the sensor circularly move along a circle of 2 mm diameter. An alphabetic letter image "E" was projected onto the image sensor of this system, as shown in FIG. 6. As a result, only the outline portions of the letter "E" were displayed on the LED display panel, as shown in FIG. 7. It was confirmed that the number of the pixels participating in the detection of each profile portion is one or two as measured from the number of the pixels which were turned on and off, in the direction of the thickness of the profile line.

Figure 8:
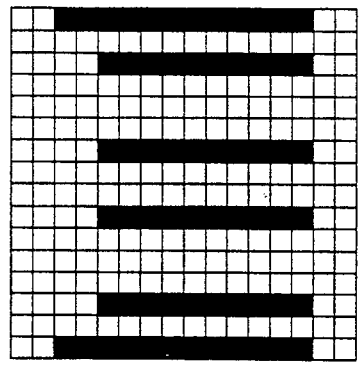
Figure 9:
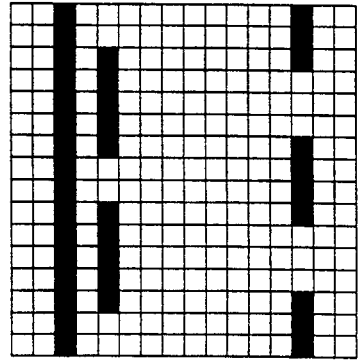

Then, the oscillation drive system was adjusted so as to give the sensor a reciprocating oscillation only in the directions parallel to the vertical axis of the letter "E" (vertical oscillation) with an amplitude of 2 mm. In this case, only the outline portions of the horizontal part of the letter "E" were displayed, as shown in FIG. 8. Moreover, the oscillation mode was changed to provide oscillation only in the horizontal directions. In this case, only the profile portions of the vertical part of the letter "E" were clearly displayed. It was thus possible to detect any desired profile component of the letter image by suitably selecting the oscillation mode. Similar extraction of profile information could be done also for other 25 alphabetic letters.

Subsequently, images of straight lines having different line widths were input, and oscillation was imparted in the vertical directions crossing the straight line images. In this case, the width of each line was displayed by two edge lines. The width represented by the distance between these two edge lines well indicated the width of each line.

What is claimed is:

1. A method of detecting image information by using a photoelectric device having a photoreception surface carrying arrays of pixels of a photosensitive material capable of directly converting an optical input signal into an electric current signal, wherein said photosensitive material inherently possesses a differential responsivity to light which outputs a photoelectric current in accordance with the rate of change in the incident light intensity of said optical input signal per unit time, whereby only mobile components of the input image information are automatically and selectively detected in real time in the form of electric signals without necessitating the use of any internally-combined image processing electric circuit for detecting such mobile components.

2. A method according to claim 1, wherein said photosensitive material provides a steady electric current output level in response to input of a stationary image information of a constant light quantity, said steady electric current output level being the same as the current output level produced by the same photosensitive material when there is no input of image information.

3. A method according to claim 1, wherein said photosensitive material contains bacteriorhodopsin or its analogs.

4. A method of detecting image information by using a photoelectric device having a photoreception surface carrying arrays of pixels of a photosensitive material capable of directly converting an optical input signal into an electric current signal, wherein an optical system through which said optical input signal is input to said photoelectric device is oscillated at a predetermined constant frequency, so as to input said optical input signal to said photoelectric device while creating a positional oscillation in directions parallel to the photoreception surface of said photoelectric device, whereby outline components of the input image information are detected in real time.

5. A method according to claim 4, wherein said photosensitive material is a differential responsive-type photosensitive material capable of producing an output of a level which varies in accordance with the rate of change in the light quantity of the optical input information.

6. A method according to claim 4, wherein said photosensitive material contains bacteriorhodopsin or its analogs.

7. A method according to claim 4, wherein the period of oscillation of said optical system is 50 ms or less.

8. A method according to claim 4, wherein the period of oscillation of said optical system is 30 ms or less.

9. A method according to claim 4, wherein the amplitude H of the positional oscillation on said photoreception surface has the following relation to the light-receiving area S of each pixel of said photosensitive material on said photoreception surface:

$$H \geq S^{1/2}$$

10. A method of detecting image information by using a photoelectric device having a photoreception surface carrying arrays of pixels of a photosensitive material capable of directly converting an optical input signal into an electric current signal, wherein said photoelectric device is mechanically oscillated in the directions parallel to the photoreception surface during the irradiation of s id photoreception surface with the optical input signal, whereby outline components of the input image information are detected in real time.

11. A method according to claim 10, wherein said photosensitive material is a differential responsive-type photosensitive material capable of producing an output the level of which varies in accordance with the rate of change in the light intensity received by said photosensitive material.

12. A method according to claim 10, wherein said photosensitive material contains bacteriorhodopsin or its analog.

13. A method according to claim 10, wherein the period of oscillation of said optical system is 50 ms or less.

14. A method according to claim 10, wherein the period of oscillation of said optical system is 30 ms or less.

15. A method according to claim 10, wherein the amplitude H of the oscillation of said photoelectric device has the following relation to the light-receiving area S of each pixel of said photosensitive material on said photoreception plane:

$$H \geq S^{1/2}$$

* * * * *